United States Patent [19]

Tachibana et al.

[11] Patent Number: 5,424,561
[45] Date of Patent: Jun. 13, 1995

[54] MAGNETIC SENSOR ELEMENT USING HIGHLY-ORIENTED DIAMOND FILM AND MAGNETIC DETECTOR

[75] Inventors: Takeshi Tachibana, Osaka; Kazushi Hayashi, Nishi; Koji Kobashi, Nishinomiya, all of Japan; Bradley A. Fox, Cary, N.C.; Jesko A. von Windheim, Raleigh, N.C.; David L. Dreifus, Cary, N.C.; Brian R. Stoner, Raleigh, N.C.

[73] Assignee: Kobe Steel USA Inc., Research Triangle Park, N.C.

[21] Appl. No.: 305,791

[22] Filed: Sep. 8, 1994

Related U.S. Application Data

[63] Continuation of Ser. No. 61,445, May 14, 1993, abandoned.

[51] Int. Cl.$^6$ ............... H01L 27/22; H01L 29/82; H01L 43/00
[52] U.S. Cl. .................... 257/77; 257/64; 257/421; 257/613
[58] Field of Search ............ 257/64, 77, 421, 425, 257/426, 427, 613; 437/103, 106

[56] References Cited

U.S. PATENT DOCUMENTS

| | | | |
|---|---|---|---|
| 4,670,968 | 6/1987 | Mikami et al. | 437/22 |
| 4,806,900 | 2/1989 | Fujimori et al. | 338/22 R |
| 5,066,938 | 11/1991 | Kobashi et al. | 338/22 SD |
| 5,086,014 | 2/1992 | Miyata et al. | 437/103 |
| 5,089,802 | 2/1992 | Yamazaki | 338/22 SD |
| 5,124,179 | 6/1992 | Garg et al. | 427/249 |
| 5,126,206 | 6/1992 | Garg et al. | 428/408 |
| 5,162,886 | 11/1992 | Nishibayashi et al. | 257/414 |
| 5,173,761 | 12/1992 | Dreifus et al. | 257/77 |
| 5,183,530 | 2/1993 | Yamazaki | 156/643 |
| 5,371,383 | 12/1994 | Miyata et al. | 257/77 |

FOREIGN PATENT DOCUMENTS

| | | |
|---|---|---|
| 421397A1 | 4/1991 | European Pat. Off. . |
| 445998A1 | 9/1991 | European Pat. Off. . |
| 59-27754 | 2/1984 | Japan . |
| 59-137396 | 8/1984 | Japan . |
| 60-12747 | 1/1985 | Japan . |
| 61-3320 | 1/1986 | Japan . |
| 61-251158 | 11/1986 | Japan . |
| 64-55862 | 3/1989 | Japan . |
| 64-68966 | 3/1989 | Japan . |
| 1-158744 | 6/1989 | Japan . |
| 1-244399 | 9/1989 | Japan . |
| 2-223437 | 9/1990 | Japan ........................ 257/77 |
| 2-273960 | 11/1990 | Japan . |
| 3-12966 | 1/1991 | Japan . |
| 3-94429 | 4/1991 | Japan . |

(List continued on next page.)

OTHER PUBLICATIONS

Tessmer, A. J., et al., "High-Temperature Operation of Polycrystalline Diamond Field-Effect Transistors", IEEE Elec. Dev. Lett. vol. 14, No. 2, Feb. 1993, pp. 66-68.

(List continued on next page.)

Primary Examiner—Sara W. Crane
Attorney, Agent, or Firm—Bell, Seltzer, Park & Gibson

[57] ABSTRACT

A magnetic sensor element using highly-oriented diamond film comprises a magnetic detecting part, at least a pair of main current electrodes for flowing a main current and generating the Hall electromotive force at the magnetic detecting part, and detection electrodes for detecting said Hall electromotive force. Said magnetic detecting part is formed of a highly-oriented diamond film grown by chemical vapor deposition, at least 90% of which consists of either (100) or (111) crystal planes. Between the adjacent crystal planes, the differences $\{\Delta\alpha, \Delta\beta, \Delta\gamma\}$ of the Euler angles $\{\alpha, \beta, \gamma\}$ which represent the orientation of the crystal planes, satisfy the following relations simultaneously: $|\Delta\alpha| \leq 10°$, $|\Delta\beta| \leq 10°$ and $|\Delta\gamma| \leq 10°$. The magnetic sensor element using highly-oriented diamond film has a high heat stability and sufficiently high level of magnetic field sensitivity to be used practically, enabling to expand the surface area and to increase the integration of the element and to measure magnetic field over a wide area and a large space.

22 Claims, 6 Drawing Sheets

FOREIGN PATENT DOCUMENTS

| | | |
|---|---|---|
| 3-110866 | 5/1991 | Japan . |
| 3-120865 | 5/1991 | Japan . |
| 3-160731 | 7/1991 | Japan . |
| 3-263872 | 11/1991 | Japan . |
| 3-278463 | 12/1991 | Japan . |
| 3-278474 | 12/1991 | Japan . |
| 4-26161 | 1/1992 | Japan . |
| 4-26172 | 1/1992 | Japan . |
| 2243949A | 11/1991 | United Kingdom . |
| 2252202A | 7/1992 | United Kingdom . |

OTHER PUBLICATIONS

Lee, Y. H., et al., "Vapor Deposition of Diamond Thin Films on Various Substrates", Appl. Phys. Lett. 57 (18) 29 Oct. 1990, pp. 1916–1918.

U.S. Patent application Ser. No. 07/811,425, filed Dec. 20, 1991, *Nucleation Enhancement for Chemical Vapor Deposition of Diamond,* Stoner et al., now abandoned.

U.S. Patent application Ser. No. 07/937,481, filed Aug. 28, 1992, *Nucleation Enhancement for Chemical Vapor Deposition of Diamond,* allowed Stoner et al., Mar. 14, 1995 5,397,428.

U.S. Patent Application Ser. No. 08/035,643, filed Mar. 23, 1993, *Microelectronic Structure Having an Array of Diamond Structures on a Nondiamond Substrate and Associated Fabrication Methods,* Dreifus et al., allowed.

Geis, Growth of textured diamond films on foreign substrates from attached seed crystals, *Appl. Phys. Lett.,* 55:550–552 (1989).

STANDARD ORIENTATION OF CRYSTAL PLANE

SURFACE STRUCTURE OF DIAMOND FILM WITH HIGHLY ORIENTED (100) CRYSTAL PLANE

MAGNETIC SENSOR ELEMENT USING HIGHLY-ORIENTED DIAMOND FILM AND MAGNETIC DETECTOR

This is a Continuation of application Ser. No. 08/061,445, filed on May 14, 1993, now abandoned.

BACKGROUND OF THE INVENTION

1. Field of the Invention

The present invention relates to a magnetic sensor element using highly-oriented diamond film and a magnetic detector suitable for use in the fields where high environmental resistance and good high-temperature stability are required.

2. Prior Art

It is known that semiconductors or semiconducting films can be used as a magnetic detector utilizing its Hall effect, i.e., a phenomenon that an electric field is produced in the direction vertical both to the electric current and the magnetic field when the electric current flows vertically to the magnetic field through a semiconducting material (for example, A Film Handbook, ed. by the File No. 131 Committee, Japan Society for the Promotion of Science, pp. 635–641 (1983)). It is also known to use the Hall elements utilizing diamond films with high temperature stability and chemical stability as said semiconducting films which may be used under high temperature of 200° C. or more (Japanese under Provisional Publication hei 4-26172). Magnetic sensors, being currently sold, utilizing Si, GaAs, InAs or InSb and the like, can not be used under such a high temperature since their semiconducting characteristics are lost. Therefore, the Hall elements utilizing diamond films are attractive due to their advantage as magnetic sensors. In addition, since diamond films have an excellent thermal conductivity and a heat dissipation property, it is possible to increase the sensitivity of diamond magnetic sensors by raising the input power.

The prior art Hall elements utilizing single crystal diamonds, however, are difficult to expand their size and to integrate since availability of large single crystal of diamond is limited. Use of single crystal diamond also raises the manufacturing cost of the Hall elements. Furthermore, the prior art Hall elements are all single elements and therefore inappropriate for simultaneous measurements of magnetic fields at different places over wide area and space.

On the other hand, the Hall elements utilizing polycrystalline diamond films can be expanded their surface area and increased the integration. Further, the manufacturing cost of the Hall elements can be reduced. However, such polycrystalline diamond films contain a high density of grain boundaries which results in a low carrier mobility (about 1 $cm_2/V.sec$) and a low magnetic field sensitivity and therefore inappropriate for practical use.

SUMMARY OF THE INVENTION

The object of the present invention is to provide a magnetic sensor element using highly-oriented diamond film and a magnetic detector, which have sufficient magnetic field sensitivity for practical use, also is capable of expanding its surface area and its integration, and have a good high temperature stability so as to enable continuous measurements of magnetic fields in large area and space.

The magnetic sensor element using highly-oriented diamond film according to the present invention comprises a magnetic detecting part formed of a diamond film grown by chemical vapor deposition, at least a pair of main current electrodes for flowing a main current and generating Hall electromotive force at this magnetic detecting part and detecting electrodes for detecting said Hall electromotive force.

Also, the present invention is characterized in that said diamond film of magnetic detecting part comprises a highly-oriented diamond film or a multi-layer of said highly-oriented diamond films. In the highly-oriented diamond film, at least 90% of the surface area consists of either (100) or (111) crystal planes. The differences $\{\Delta\alpha, \Delta\beta, \Delta\gamma\}$ of the Euler angles $\{\alpha, \beta, \gamma\}$, which represent the orientation of the crystal planes, between the adjacent crystal planes simultaneously satisfy the following relations: $|\Delta\alpha| \leq 10°$, $|\Delta\beta| \leq 10°$ and $|\Delta\gamma| \leq 10°$.

In this case, preferably said main electrodes are placed each other within a distance of 100 μm, more preferably within about 10 μm.

In the magnetic detector according to the present invention the magnetic sensor element using said highly-oriented diamond film may be aligned one-dimensionally, two-dimensionally or three-dimensionally.

According to the present invention, since the highly-oriented diamond film is used as the magnetic detecting part, the carrier mobility, which is one of concerns in the prior art polycrystalline diamond film, is significantly improved and the magnetic detecting part can be constructed so as to have sufficiently high level of magnetic field sensitivity to be used practically.

Furthermore, in the magnetic sensor element according to the present invention, an expansion of the surface area and an increase in the integration of the element, which are impossible for the elements utilizing natural or single crystal diamond, can be achieved while its electric characteristics are maintained at almost same level as those of the elements utilizing single crystal diamond as aforementioned, and therefore the present invention provides, with low cost, the magnetic sensor element for detecting magnetic fields and the magnetic detector with wide surface area and high performance of integration.

In addition, the magnetic sensor element for detecting magnetic fields and the magnetic detector according to the present invention have a high thermal conductivity as well as heat and chemical stabilities due to characteristics of diamond and therefore can be used under severe environmental conditions such as high temperature and radiation exposure.

BRIEF DESCRIPTION OF THE DRAWINGS

FIG. 5(a) shows a linear type array and FIG. 5(b) shows a two dimensional-type array.

DETAILED DESCRIPTION OF THE PREFERRED EMBODIMENTS

Figure 1A:
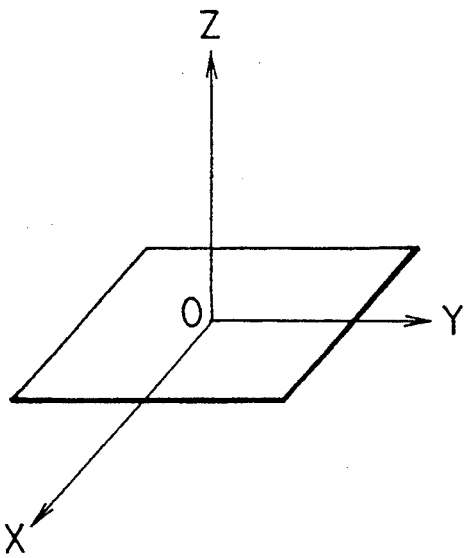
FIGS. 1a and 1b are diagrams showing a highly-oriented diamond film according to the present invention.
Figure 1B:
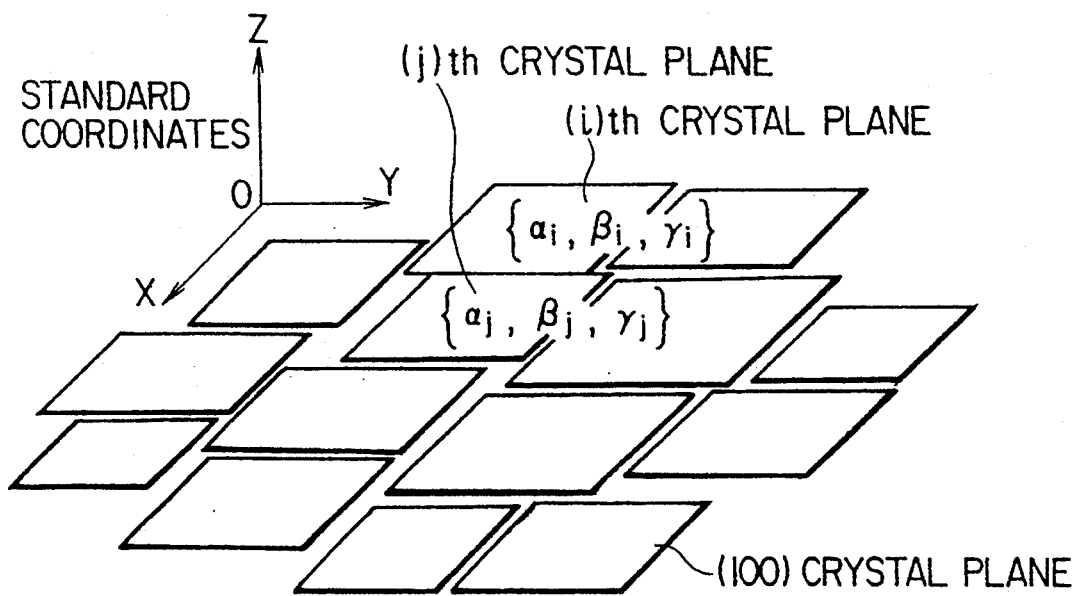

FIG. 1 shows diagrammatically the surface structure of a diamond film of the invention wherein the (100) crystal plane is highly oriented according to this invention. This diagram defines the x-axis and the y-axis which cross at right angles to each other in a film surface also defining the normal direction of the film surface as the z-axis. The Euler angles indicating the orientation of crystal plane of the (i)th diamond crystal and the adjacent (j)th diamond crystal are to be regarded as $\{\alpha_i, \beta_i, \gamma_i\}$ and $\{\alpha_j, \beta_j, \gamma_j\}$ respectively, and the angle differences between the two as $\{\Delta\alpha, \Delta\beta, \Delta\gamma\}$.

The Euler angles $\{\alpha, \beta, \gamma\}$ indicate the orientation of the crystal plane that can be attained by rotating the standard crystal plane around the standard coordinates of axis z, y and z by the angles $\alpha$, $\beta$ and $\gamma$ one after another.

According to this invention, the highly oriented diamond film satisfies ($|\Delta\alpha| \leq 10°$, $|\Delta\beta| \leq 10°$ and $|\Delta\gamma| \leq 10°$) simultaneously. It therefore follows that the crystals are oriented to a high degree and that the carrier mobility is as high as that of a homoepitaxial diamond film.

For the case of crystals with the (111) crystal plane as well, the crystals are highly oriented and the carrier mobility becomes high when all the absolute values of the differences in Euler angles are below 10°. Such a highly-oriented diamond film can be formed, for instance, by subjecting a silicon substrate to microwave irradiation while applying a negative bias in the gas phase containing methane gas after the silicon substrate has been mirror-like finished.

Also, in the present invention, at least 90% of the surface area of the deposited diamond film is covered with either (100) or (111) crystal planes. Although the highly-oriented diamond film as shown in FIG. 1 still contains grain boundaries between diamond grains, the angle deviation among crystal planes is small due to the high orientation of crystal plane which results in significantly low carrier scattering compared to the prior art polycrystalline film. The carrier trapping also decreases due to the decrease of defects existing along, grain boundaries. For these reasons, the electric characteristics of said highly-oriented diamond film are substantially improved compared to the prior art polycrystalline films. Such improvements of electric characteristics can be achieved by restricting the coverage of diamond film to at least 90% of the total surface area of the substrate and the angle differences $\{\Delta\alpha, \Delta\beta, \Delta\gamma\}$ to 10° or less. These conditions were obtained from the experimental results of first embodiments described later. Any highly-oriented diamond films which do not meet these conditions have poorer electric characteristics.

A further advantage of said highly-oriented diamond film is that there is no limitation of its surface area unlike single crystal diamond because said highly-oriented diamond film can be deposited on silicon wafers and the like which have the surface area of several inches in diameter. Therefore, highly-oriented diamond film with wide surface areas can be obtained.

Another advantage of said highly-oriented diamond film is that the carrier mobility in the highly-oriented diamond film is about 500 $cm^2/V.sec$ which is very close to the carrier mobility of single crystal diamond, since the carrier scattering and the carrier trapping by grain boundaries affect in very small extent as mentioned above.

Further advantage of the present invention is that the magnetic sensor element is practically useful in both point of views of sensitivity and manufacturing cost because the magnetic detecting part comprises said highly-oriented diamond film. That is, the magnetic sensor element according to the present invention can detect the Hall electromotive force above the noise level even under high temperature more than 200° C. because the magnetic detecting part comprises highly-oriented diamond film or films.

According to the present invention, many elements can be manufactured simultaneously with a low manufacturing cost, since highly-oriented diamond film can be deposited on any non-diamond substrates with large surface areas of 10 $cm^2$ of more.

Further advantage of the present invention is that the elements for detecting magnetic fields, which have identical characteristics can be aligned on one substrate along a straight line, curve, plane or curved surface by the photolithographic technique so as to array and therefore can be used to measure the distribution of magnetic field in a space simultaneously.

DETAILED DESCRIPTION OF THE PREFERRED EMBODIMENTS

Figure 2:
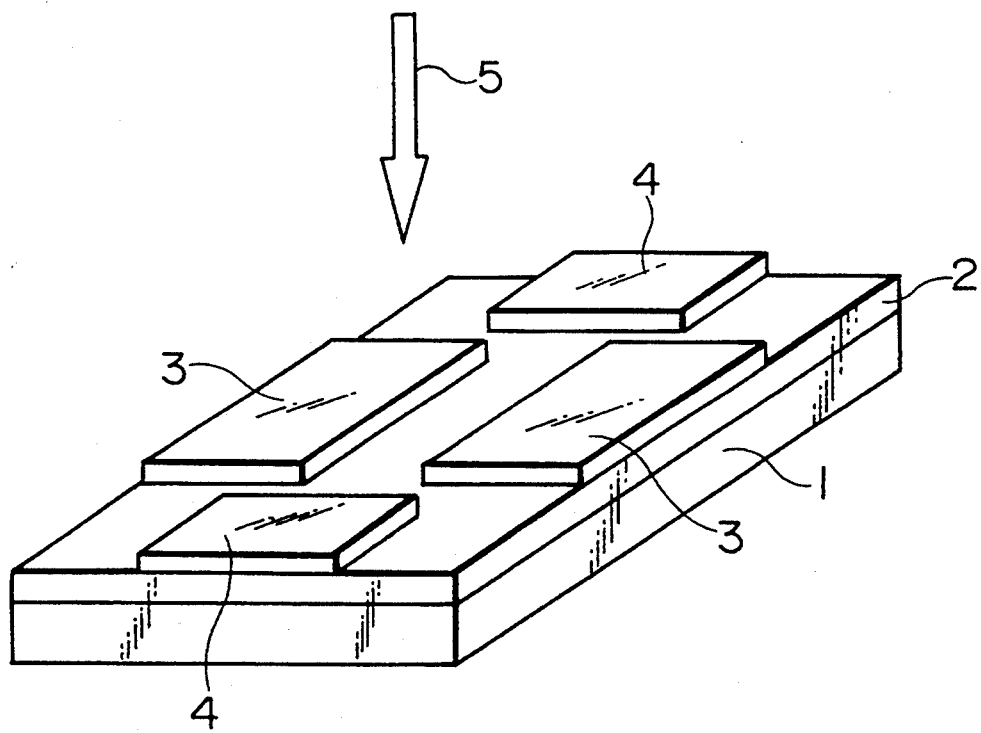
FIG. 2 is a perspective view showing a planer-type sensor element according to a first embodiment of the present invention.

Referring to the drawings attached, embodiments of the present invention will be described. FIG. 2 is a perspective view showing the magnetic sensor element according to a first-embodiment of the present invention. This magnetic sensor element is a planer-type element. A diamond film 2 doped with boron (B) which acts as a magnetic detecting part (sensor part) is deposited on a substrate 1 made of Si, $Si_3N_4$ or insulating diamond and the like.

The form of this magnetic detecting part can be patterned by photolithography and the preferred depositing technique. The magnetic detecting part also can be processed by utilizing the etching technique such as the plasma etching and the electron beam etching. This semiconducting diamond film 2 is the highly oriented B-dope diamond film which is manufactured and defined as aforementioned.

On this semiconducting diamond film 2 are placed a pair of main current electrodes 3 and a pair of Hall electromotive force detecting electrodes 4 so as to intersect each other at the facing direction. These electrodes 3, 4 can be constructed using various metals (such as Ti, Ta, Mo, W and Cr and the like), alloy (such as Ti-W and the like) and metal conductive compounds (such as TiC, TiN, $TiB_2$, $TaSi_2$ and the like) grown by chemical vapor deposition such as heat deposition, spattering, electron beam deposition and CVD methods. These electrodes may be a multi-layer film constructed by layering these metal films on one and another.

It is also advantageous to make high concentration B-dope on the surface of the semiconducting diamond film 2 in the part forming the electrode so as to form the ohmic contact thereon.

Next, the operation of the magnetic sensor element thus constructed according to this embodiment will be described.

While applying electric current through a pair of the main current electrodes 3 facing each other to the semiconducting diamond film 2 formed the magnetic detecting part, the magnetic sensor element is placed in magnetic field so as to apply the magnetic field 5 vertically on the surface of the semiconducting diamond film 2. As a result, the Hall electromotive force is generated toward intersecting the direction of current flow between the electrodes 3 and the direction of magnetic field 5 by the interaction between the magnetic field 5 and the current flow between the electrodes 3, and the Hall electromotive force can be measured by the electrodes 4 placed on the direction of this Hall electromotive force.

Figure 3:
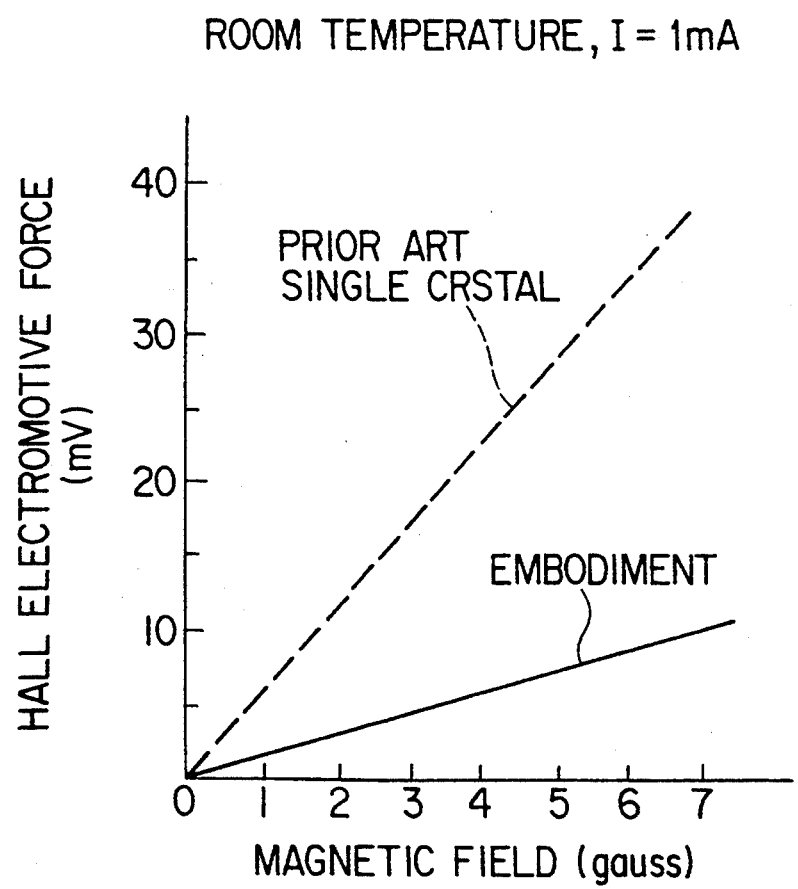
FIG. 3 is a graph showing the relationship between the magnetic field and Hall electromotive force (magnetic field sensitivity characteristics) of the magnetic sensor element according to the first embodiment of the present invention at room temperature.

In FIG. 3, the magnetic field sensitivity characteristics of the magnetic sensor element thus constructed in the structure illustrated in FIG. 2 is shown by a solid line under room temperature. In FIG. 3, x-axis shows the magnetic field (gauss) and y-axis shows the Hall electromotive force (mV). The current between the main electrodes 3 is 1 mA. In FIG. 3, the dotted line indicates the characteristics of the Hall element obtained when single crystal diamond film is used for the magnetic detecting part according to the prior art (Japanese under Provisional Publication hei 4-26172). As shown in FIG. 2, the magnetic sensor element according to the present invention gives sufficient magnetic field sensitivity to be practically useful although it is slightly inferior in magnetic field sensitivity characteristics to the element utilizing single crystal.

Figure 4:
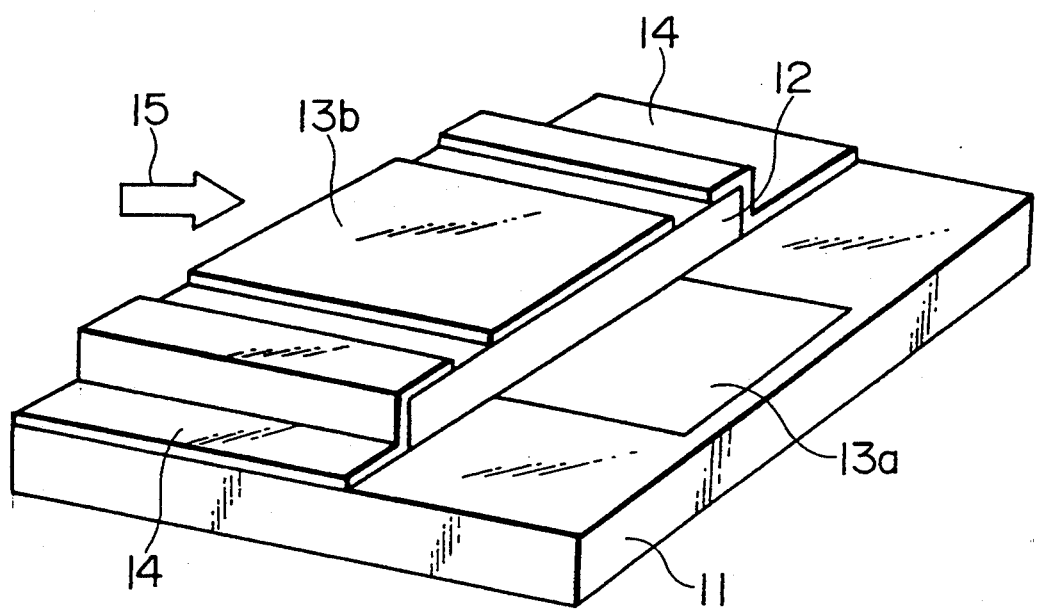
FIG. 4 is a perspective view showing a vertical-type magnetic sensor element according to a second embodiment of the present invention.

Then, a second embodiment of the present invention will be explained referring FIG. 4. This embodiment relates to the vertical-type magnetic sensor element in which the element possessing similar effect as the first embodiment is formed vertical direction. As shown in FIG. 4, an electrode 13a, one of paired main current electrodes, is formed by vapor deposition on the insulating substrate 11. The semiconducting diamond film 12 is formed on the substrate 11 and the electrode 13a by patterning so as to cover a part of the electrode 13a and to extend wider than this covered part on the substrate 11.

This semiconducting diamond film 12 is also a highly oriented diamond film. Another electrode 13b of paired main current electrodes for applying main electric current is formed in the area of the semiconducting diamond film 12 where the semiconducting diamond film 12 and the electrode 13a cross over when viewed over. A part of the paired electrodes 14 for measurement of the Hall electromotive force is formed on the area of semiconducting diamond film 12 uncovered by the main electrode 13b and these electrodes 14 are extending from this part to the surface of the substrate 11 through the side face of the semiconducting diamond film 12.

Then, the operation of the magnetic sensor element thus constructed will be explained. In this embodiment, by applying electric current between the electrodes 13a and 13b, the current flows vertically through the diamond film 12.

Then, this magnetic sensor element is placed in magnetic field so as to effect the direction of the magnetic field 15 in parallel to the surface of the semiconducting diamond film 12 and in vertical to the direction facing to each of the electrodes 14. Consequently, the Hall electromotive force is generated toward the vertical direction to the surface of the electrodes 13a and 13b, i.e., the vertical direction to the surface of the substrate, and the magnetic field 15 and this Hall electromotive force can be detected by the electrode 14.

The element structure of this embodiment has advantage that the electrode distance between the main electrodes 13a and 13b can be optionally selected 100 μm or less since the film thickness can be easily controlled during chemical vapor deposition of diamond on the substrate 11.

There is another advantage of this magnetic sensor element structure that large electric current can be flowed between the electrodes 13a and 13b and therefore the magnetic field sensitivity of the element can be increased since the surface area of the magnetic detecting part of the electrodes 13a and 13b, i.e., the surface area of the semiconducting diamond film 12 can be expanded during the formation.

Figure 5A:
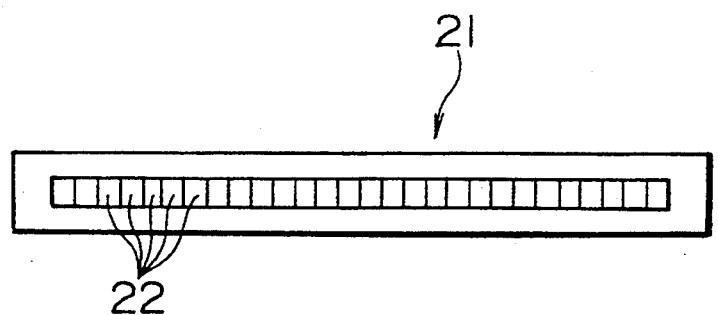
FIG. 5A and 5B show magnetic detectors (sensor arrays) according to the present invention.
Figure 5B:
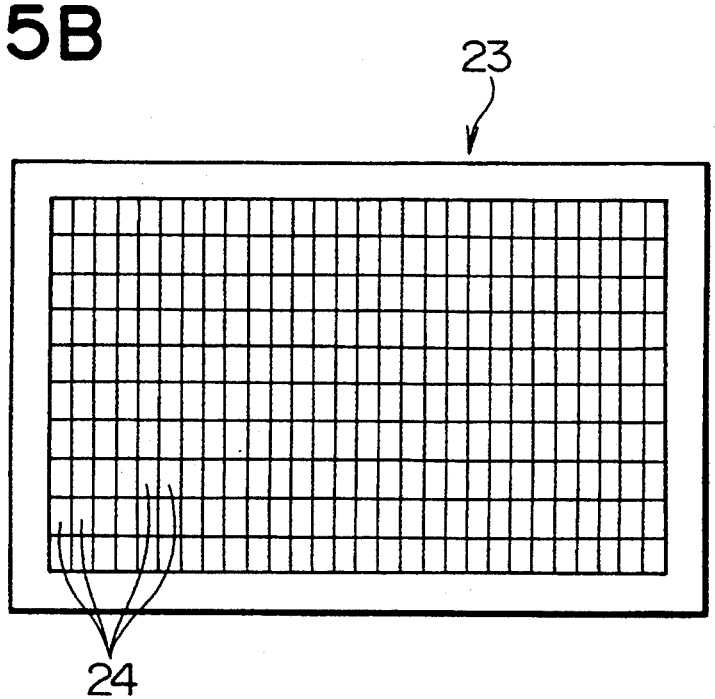

FIG. 5A and 5B show the magnetic detectors (a sensor for detecting and measuring magnetism) comprising the magnetic sensor element shown in FIG. 2 or FIG. 4.

FIG. 5A shows the linear array 21 formed by one-dimensional alignment of the elements 22 shown in FIG. 2 or FIG. 4. And, FIG. 5b shows the plane array 23 formed by two-dimensional alignment of the elements 24 also shown in FIG. 2 or FIG. 4.

The array 21 and 23 formed in this way can be used for simultaneous and continuous measurement of the magnetic field distribution in wide area.

In embodiments shown in FIG. 2 and FIG. 4, the magnetic sensor element has only four terminals, however the magnetic sensor element may comprises 3 or 5 electrodes, and having similar effect can be made.

The magnetic sensor element according to the present invention was actually manufactured and results of evaluation of its characteristics will be explained.

(Step 1)

A one inch silicon wafer with (100) plane was used as a substrate to deposit a highly oriented diamond film thereon. The substrate was placed in a chamber for microwave chemical vapor deposition and treated for 15 minutes under following conditions: 5% of methane, 95% of hydrogen, gas pressure at 25 Torr, gas flow rate at 300 ml/min, substrate temperature at 650° C. Power source of about 1000 W was used to generate microwave, but the power was adjusted so as to maintain the constant substrate temperature at 650° C. At the same time, a negative bias was applied to the substrate. The negative biasing current was 30 mA/cm$^2$.

(Step 2)

Subsequently, the diamond film deposition was continued for 80 hours under the following conditions: 5% of methane, 93% of hydrogen, 2% of oxygen, gas pressure at 60 Torr, gas flow rate at 300 ml/min, substrate temperature at 800° C. As a result, the highly-oriented diamond film with about 80 μm of thickness was obtained.

Electron microscopic observation indicated that 90% of this film surface was covered by the (100) crystal plane. From photograph of vertical section of the film, the maximum deviation of vertical length among crystals was found to be 0.8 μm.

Two electron microscopic photographs of the film surface were taken each at angle +5° and −5° from the line normal to the film surface and the inclination of the (100) cyrstalline plane was determined based on the photographs. Results indicated that the deviation of surface inclination between adjacent crystals satisfied all conditions of $|\Delta\alpha| \leq 10°$, $|\Delta\beta| \leq 10°$ and $|\Delta\gamma| \leq 10°$.

(Step 3)

The P-type semiconducting diamond film was further deposited on this highly oriented film. The deposition was conducted under the following conditions: 2% of methane, 98% of hydrogen, 1 ppm of diborane ($B_2H_6$), gas pressure at 50 Torr, gas flow at 300 ml/min, substrate temperature at 800° C. As a result, the 3 μm thick P-type semiconducting diamond film having the morphologically same surface as the underlying highly-oriented film could be obtained.

Determination of the Hall mobility of this semiconducting diamond layer indicated very high value of 500 $cm^2$/V.sec. This value is about 500 times higher than that (about 1 $cm^2$/V.sec.) for the prior art polycrystalline diamond film.

(Step 4)

Similar experiments were repeated changing conditions listed in Step 1 as the following Table 1. Sample No. 1 shown in Table 1 was prepared according to the same conditions as listed in Step 1.

TABLE 1

| Sample No. | Concentration of methane (%) | Concentration of hydrogen (%) | Temperature on substrate (°C.) |
|---|---|---|---|
| 1 | 5 | 95 | 650 |
| 2 | 3 | 97 | 650 |
| 3 | 1 | 99 | 650 |
| 4 | 10 | 90 | 700 |
| 5 | 20 | 80 | 700 |

Under the conditions for the samples 2 and 3 shown in Table 1, the diamond film in which 96% and 98% respectively of the film surface were covered by (100) crystal planes and the deviation of crystal plane inclination between adjacent crystals is satisfied the relations of $|\Delta\alpha| \leq 10°$, $|\Delta\beta| \leq 10°$ and $|\Delta\gamma| \leq 10°$ was obtained.

On the other hand, in the samples 4 and 5, 80% and 70% respectively of the film surface were covered by (100) crystal planes and the deviation of crystal surface inclination between adjacent crystals was fallen in the range of $|\Delta\alpha| \leq 10°$, $|\Delta\beta| \leq 10°$ and $|\Delta\gamma| \leq 10°$.

Figure 6:
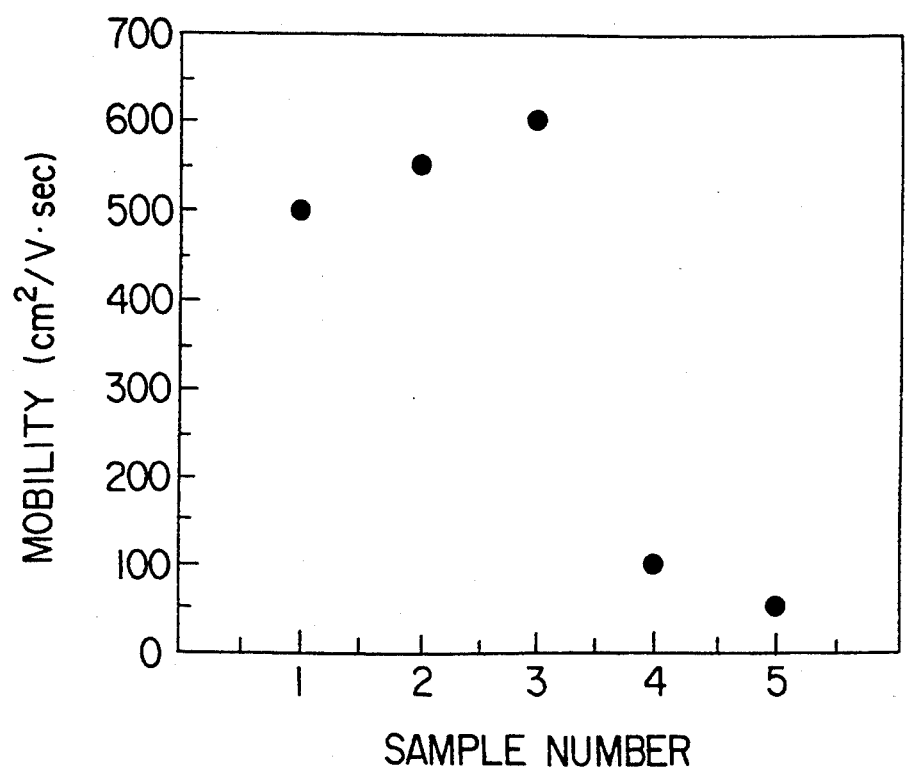
FIG. 6 is a graph showing the Hall mobility illustrating the effect of the present invention.

Then, the Hall mobility of samples 1 to 5 was determined. Results of this determination was presented in FIG. 6. In this Figure, X-axis indicates the sample number and Y-axis the Hall mobility. As clearly shown in FIG. 5, the Hall mobility is very high in the highly oriented diamond films (samples 1, 2 and 3) satisfying all conditions defined in the present invention while the Hall mobility is very low in the samples 4 and 5 which do not satisfy the relations set forth in the present invention. Thus, it is concluded that the highly-oriented diamond film according to the present invention has sufficient characteristics to be practically used as a Hall element.

What is claimed is:

1. A magnetic sensor element using highly-oriented diamond film comprising;

a magnetic detecting part formed of highly-oriented diamond film, said diamond film being grown by chemical vapor deposition, at least 90% of the surface area of said diamond film consisting of (100) crystal planes, and the differences {$\Delta\alpha$, $\Delta\beta$, $\Delta\gamma$} of the Euler angles {$\alpha$, $\beta$, $\gamma$}, indicating the orientations of the crystals, satisfying $|\Delta\alpha| \leq 10°$, $|\Delta\beta| \leq 10°$ and $|\Delta\gamma| \leq 10°$ simultaneously between adjacent (100) crystal planes;

at least a pair of main current electrodes for flowing a main current and generating Hall electromotive force at the magnetic detecting part; and detection electrodes for detecting said Hall electromotive force.

2. A magnetic sensor element using highly-oriented diamond film comprising;

a magnetic detecting part formed of highly-oriented diamond film, said diamond film being grown by chemical vapor deposition, at least 90% of the surface area of said diamond film consisting of (111) crystal planes, and the differences {$\Delta\alpha$, $\Delta\beta$, $\Delta\gamma$} of the Euler angles {$\alpha$, $\beta$, $\gamma$}, indicating the orientations of the crystals, satisfying $|\Delta\alpha| \leq 10°$, $|\Delta\beta| \leq 10°$ and $|\Delta\gamma| \leq 10°$ simultaneously between adjacent (111) crystal planes;

at least a pair of main current electrodes for flowing a main current and generating Hall electromotive force at the magnetic detecting part; and detection electrodes for detecting said Hall electromotive force.

3. A magnetic sensor element using highly-oriented diamond film according to claim 1, wherein said main current electrodes are placed each other within a distance of 100 μm.

4. A magnetic sensor element using highly-oriented diamond film according to claim 2, wherein said main current electrodes are placed each other within a distance of 100 μm.

5. A magnetic sensor element using highly-oriented diamond film according to claim 1, wherein said highly-oriented diamond film is a P-type semiconductor.

6. A magnetic sensor element using highly-oriented diamond film according to claim 2, wherein said highly-oriented diamond film is a P-type semiconductor.

7. A magnetic sensor element using highly oriented diamond film according to claim 1, wherein said highly-oriented diamond film of magnetic detecting part is grown on a substrate made of diamond film deposited by chemical vapor deposition or a non-diamond substrate.

8. A magnetic sensor element using highly oriented diamond film according to claim 2, wherein said highly-oriented diamond film of magnetic detecting part is grown on a substrate made of diamond film deposited by chemical vapor deposition or a non-diamond substrate.

9. A magnetic sensor element using highly-oriented diamond film according to claim 1, wherein said highly-oriented diamond film of magnetic detecting part is formed into a pattern with size of 1 $mm^2$ or less by selective growth or etching technique.

10. A magnetic sensor element using highly-oriented diamond film according to claim 2, wherein said highly-oriented diamond film of magnetic detecting part is formed into a pattern with size of 1 $mm^2$ or less by selective growth or etching technique.

11. A magnetic detector comprising a plurality of units aligned one-dimensionally, two-dimensionally or three-dimensionally, each of said units being consisted of said magnetic sensor element using highly-oriented diamond film according to claim 1.

12. A magnetic detector comprising a plurality of units aligned one-dimensionally, two-dimensionally or three-dimensionally, each of said units being consisted of said magnetic sensor element using highly-oriented diamond film according to claim 2.

13. A magnetic sensor element using highly-oriented diamond film comprising;
   a magnetic detecting part formed of a multi-layered highly-oriented diamond films, each of said diamond film being grown by chemical vapor deposition, at least 90% of the surface area of said diamond film consisting of (100) crystal planes, and the differences $\{\Delta\alpha, \Delta\beta, \Delta\gamma\}$ of the Euler angles $\{\alpha, \beta, \gamma\}$, indicating the orientations of the crystals, satisfying $|\Delta\alpha|\leq 10°$, $|\Delta\beta|\leq 10°$ and $|\Delta\gamma|\leq 10°$ simultaneously between adjacent (100) crystal planes;
   at least a pair of main current electrodes for flowing a main current and generating Hall electromotive force at the magnetic detecting part; and
   detection electrodes for detecting said Hall electromotive force.

14. A magnetic sensor element using highly-oriented diamond film comprising;
   a magnetic detecting part formed of a multi-layered highly-oriented diamond film, each of said diamond film being grown by chemical vapor deposition, at least 90% of the surface area of said diamond film consisting of (111) crystal planes, and the differences $\{\Delta\alpha, \Delta\beta, \Delta\gamma\}$ of the Euler angles $\{\alpha, \beta, \gamma\}$, indicating the orientations of the crystals, satisfying $|\Delta\alpha|\leq 10°$, $|\Delta\beta|\leq 10°$ and $|\Delta\gamma|\leq 10°$ simultaneously between adjacent (111) crystal planes;
   at least a pair of main current electrodes for flowing a main current and generating Hall electromotive force at the magnetic detecting part; and
   detection electrodes for detecting said Hall electromotive force.

15. A magnetic sensor element Using highly-oriented diamond film according to claim 13, wherein said highly-oriented diamond films are P-type semiconductor.

16. A magnetic sensor element using highly-oriented diamond film according to claim 14, wherein said highly-oriented diamond films are P-type semiconductor.

17. A magnetic sensor element using highly oriented diamond film according to claim 13, wherein said highly-oriented diamond films of magnetic detecting part are grown on a substrate made of diamond film deposited by chemical vapor deposition or a non-diamond substrate.

18. A magnetic sensor element using highly oriented diamond film according to claim 14, wherein said highly-oriented diamond films of magnetic detecting part are grown on a substrate made of diamond film deposited by chemical vapor deposition or a non-diamond substrate.

19. A magnetic sensor element using highly-oriented diamond film according to claim 13, wherein said highly-oriented diamond films of magnetic detecting part are formed into a pattern with size of 1 mm² or less by selective growth or etching technique.

20. A magnetic sensor element using highly-oriented diamond film according to claim 14, wherein said highly-oriented diamond films of magnetic detecting part are formed into a pattern with size of 1 mm² or less by selective growth or etching technique.

21. A magnetic detector comprising a plurality of units aligned one-dimensionally, two-dimensionally or three-dimensionally, each of said units being consisted of said magnetic sensor element using highly-oriented diamond film according to claim 13.

22. A magnetic detector comprising a plurality of units aligned one-dimensionally, two-dimensionally or three-dimensionally, each of said units being consisted of said magnetic sensor element using highly-oriented diamond film according to claim 14.

* * * * *